(12) United States Patent
Pagaila et al.

(10) Patent No.: US 7,750,455 B2
(45) Date of Patent: Jul. 6, 2010

(54) TRIPLE TIER PACKAGE ON PACKAGE SYSTEM

(75) Inventors: Reza Argenty Pagaila, Singapore (SG); Byung Tai Do, Singapore (SG)

(73) Assignee: Stats Chippac Ltd., Singapore (SG)

( * ) Notice: Subject to any disclaimer, the term of this patent is extended or adjusted under 35 U.S.C. 154(b) by 103 days.

(21) Appl. No.: 12/188,210

(22) Filed: Aug. 8, 2008

(65) Prior Publication Data
US 2010/0032821 A1 Feb. 11, 2010

(51) Int. Cl.
*H01L 23/02* (2006.01)
*H01L 23/538* (2006.01)

(52) U.S. Cl. .............. 257/686; 257/E23.169

(58) Field of Classification Search ........ 257/686, 257/E23.169
See application file for complete search history.

(56) References Cited

U.S. PATENT DOCUMENTS

| | | | |
|---|---|---|---|
| 5,977,640 A | 11/1999 | Bertin et al. | |
| 6,137,164 A | 10/2000 | Yew et al. | |
| 6,650,006 B2 | 11/2003 | Huang et al. | |
| 6,787,916 B2 | 9/2004 | Halahan | |
| 6,861,288 B2 | 3/2005 | Shim et al. | |
| 6,919,627 B2 | 7/2005 | Liu et al. | |
| 7,015,571 B2 | 3/2006 | Chang et al. | |
| 7,026,709 B2 | 4/2006 | Tsai et al. | |
| 7,198,980 B2 | 4/2007 | Jiang et al. | |
| 7,262,074 B2 | 8/2007 | Hall et al. | |
| 7,279,786 B2 | 10/2007 | Kim | |
| 7,288,835 B2 | 10/2007 | Yim et al. | |
| 7,298,033 B2 | 11/2007 | Yoo | |
| 7,309,913 B2 | 12/2007 | Shim et al. | |
| 7,312,518 B2 | 12/2007 | Liao et al. | |
| 7,354,800 B2 | 4/2008 | Carson | |
| 7,364,945 B2 | 4/2008 | Shim et al. | |
| 7,391,105 B2* | 6/2008 | Yeom | 257/686 |
| 7,504,284 B2 | 3/2009 | Ye et al. | |
| 7,557,443 B2* | 7/2009 | Ye et al. | 257/723 |
| 2004/0178508 A1* | 9/2004 | Nishimura et al. | 257/778 |
| 2006/0175695 A1 | 8/2006 | Lee | |
| 2007/0176275 A1 | 8/2007 | Singleton et al. | |
| 2007/0181990 A1 | 8/2007 | Huang et al. | |
| 2007/0216010 A1 | 9/2007 | Yim et al. | |
| 2009/0166834 A1 | 7/2009 | Yoon et al. | |
| 2009/0243073 A1* | 10/2009 | Carson et al. | 257/686 |

* cited by examiner

*Primary Examiner*—Luan C Thai
(74) *Attorney, Agent, or Firm*—Mikio Ishimaru

(57) ABSTRACT

An integrated circuit package system includes: providing a first package having a first interposer mounted over a first integrated circuit and the first integrated circuit encapsulated by a first encapsulation; and connecting a second package over the first interposer and on the first encapsulation, the second package including a second integrated circuit having a wire-in-film adhesive thereover, a second interposer mounted on the wire-in-film adhesive and encapsulated by a second encapsulation encapsulating the second integrated circuit, the second interposer including an interconnection pad for connecting a third package to the top thereof.

20 Claims, 3 Drawing Sheets

TRIPLE TIER PACKAGE ON PACKAGE SYSTEM

CROSS-REFERENCE TO RELATED APPLICATION(S)

The present application contains subject matter related to co-pending U.S. patent application Ser. No. 11/965,641. The related application is assigned to STATS ChipPAC Ltd.

TECHNICAL FIELD

The present invention relates generally to integrated circuits and more particularly to a system for utilizing an interposer and mold risers in a package on package system.

BACKGROUND ART

The rapidly growing portable electronics market, e.g. cellular phones, laptop computers, and PDAs, are an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides an integrated circuit package system that includes: providing a first package having a first interposer mounted over a first integrated circuit and the first integrated circuit encapsulated by a first encapsulation; and connecting a second package over the first interposer and on the first encapsulation, the second package including a second integrated circuit having a wire-in-film adhesive thereover, a second interposer mounted on the wire-in-film adhesive and encapsulated by a second encapsulation encapsulating the second integrated circuit, the second interposer including an interconnection pad for connecting a third package to the top thereof.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
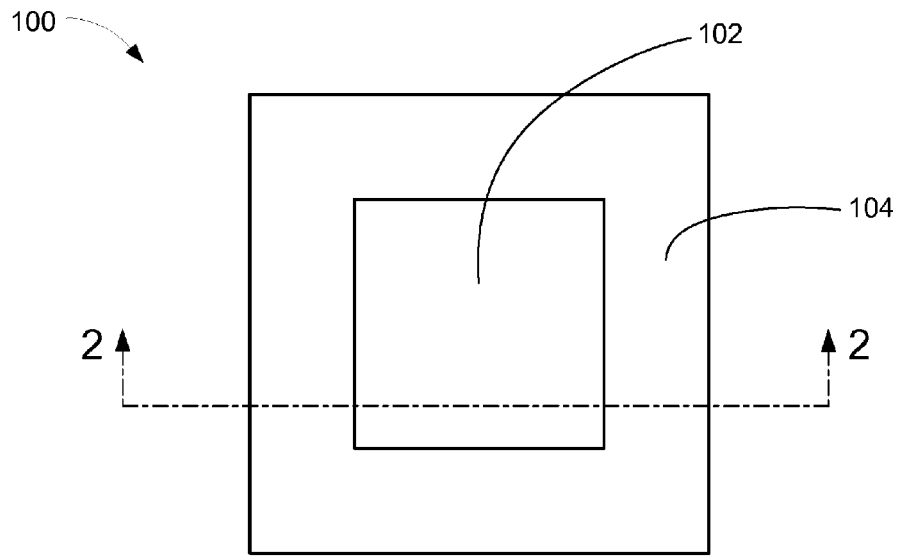
FIG. 1 is a top view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. The same numbers are used in all the drawing FIGs. to relate to the same elements.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure. The term "system" as used herein refers to and is defined as the method and as the apparatus of the present invention in accordance with the context in which the term is used.

Referring now to FIG. 1, therein is shown a top view of an integrated circuit package system 100 in a first embodiment of the present invention. The integrated circuit package system 100 is shown having a third package 102 mounted above a second encapsulation 104.

Figure 2:
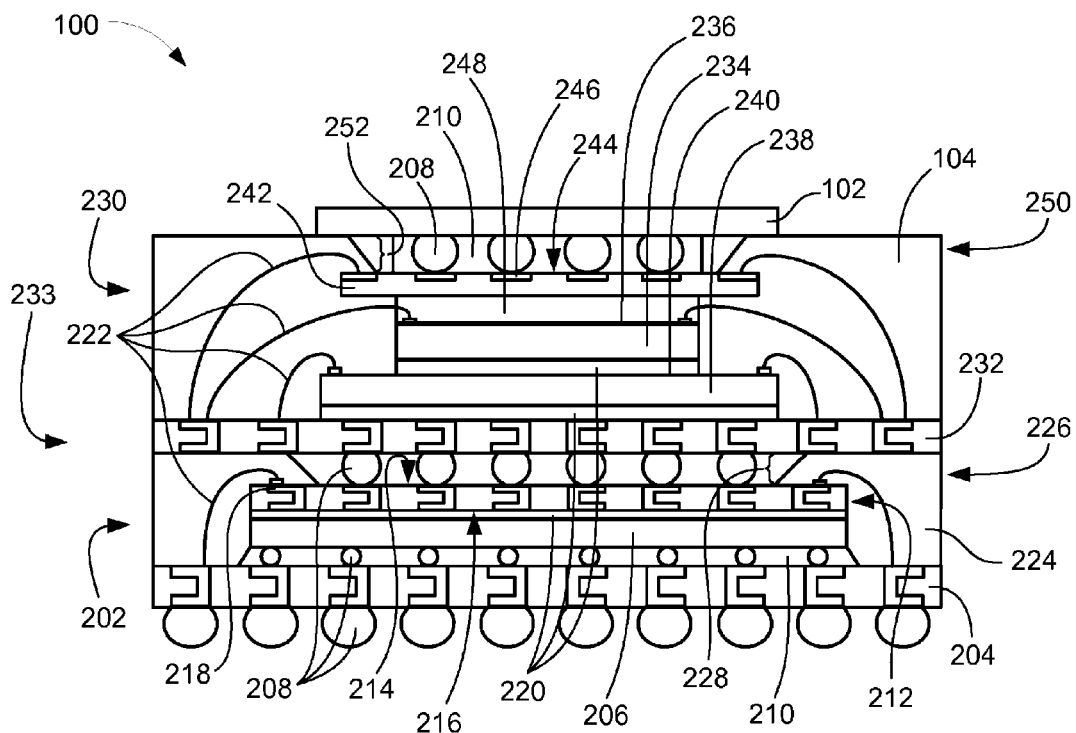
FIG. 2 is a cross-sectional view of the integrated circuit package system along the line 2-2 of FIG. 1.

Referring now to FIG. 2, therein is shown a cross-sectional view of the integrated circuit package system 100 along the line 2-2 of FIG. 1. The integrated circuit package system 100 is shown having a first package 202. The first package 202 has a first substrate 204 such as a laminated plastic or ceramic substrate.

Mounted above the first substrate 204 is a first integrated circuit 206 such as a flip chip. The first integrated circuit 206 may be replaced with a wire-bonded die, an inner stacking module, or an inverted inner stacking module.

The first integrated circuit 206 is connected to the first substrate 204 with interconnects 208 such as solder balls. Between the interconnects 208 an under-fill 210 is used to stabilize the first integrated circuit 206 and to reinforce the solder balls 208.

Mounted above the first integrated circuit 206 is a first interposer 212. The first interposer 212 is shown having two functional sides, such as a first functional side 214 and a second functional side 216, which allow for electrical signals to be routed between interconnection pads 218. The first interposer 212 is typically a UV stabilized woven glass and epoxy resin with etched copper conductive pathways.

The first interposer 212 is attached to the first integrated circuit 206 with a die attach adhesive 220. The first interposer 212 is connected to the first substrate 204 with an interconnection such as bond wires 222. Encapsulating the first integrated circuit 206, the bond wires 222 and the first interposer 212 is a first encapsulation 224 such as an epoxy mold compound (EMC).

The first encapsulation 224 has mold risers 226, which provide a standoff height 228 above the first interposer 212. The mold risers 226 are formed around the bond wires 222. Mounted above the first package 202 is a second package 230.

The second package 230 has a second substrate 232 such as a laminated plastic or ceramic substrate. The second substrate 232 of the second package 230 is connected to the first interposer 212 of the first package 202 with the solder balls 208.

The standoff height 228 provides room for the solder balls 208, while the mold risers 226 offer structural support for the second package 230 and decreases stress loading on the solder balls 208 connecting the second package 230 to the first package 202.

It has been discovered that the use of the mold risers 226 to support the second package 230 greatly increases the structural resistance to mechanical shock and helps to ensure long life of the solder balls 208 by decreasing the stresses placed on the solder balls 208.

A dual fan-in package-on-package structure 233 is defined as the first package 202 and the second package 230 joined using the mold risers 226 of the first encapsulation 224 and providing the standoff height 228 to decrease structural strain on the interconnects 208.

The dual fan-in package-on-package structure 233 also includes the second substrate 232 connected to the first interposer 212 using the interconnects 208. The second substrate 232 of the second package 230 is attached to the mold risers 226 of the first encapsulation 224.

Using the dual fan-in package-on-package structure 233 also reduces warpage because of the increased structural support. In addition, it has been discovered that the use of the solder balls 208 connected to the first interposer 212 allows for a finer pitch to be used. This finer pitch enables the use of higher density in the second package 230. The number of I/O may also be increased in the second package 230 due to finer pitch of the solder balls 208.

Mounted above the second substrate 232 is a second integrated circuit 234 such as a first wire-bonded die with an active side 236. Mounted below the second integrated circuit 234 is a third integrated circuit 238 such as a second wire-bonded die with an active side 240.

The third integrated circuit 238 is attached to the second substrate 232 with the die attach adhesive 220. The second integrated circuit 234 is attached to the active side 240 of the third integrated circuit 238 with the die attach adhesive 220.

The active side 236 of the second integrated circuit 234 is connected to the second substrate 232 with the bond wires 222. The active side 240 of the third integrated circuit 238 is connected to the second substrate 232 with the bond wires 222.

Mounted above the second integrated circuit 234 is a second interposer 242. The second interposer 242 is shown having a functional side 244 which allow for electrical signals to be routed between interconnection pads 246 exposed from the functional side 244.

It has been discovered that the second interposer 242 may be smaller than the first interposer 212. This allows for a reduction in production costs due to more efficient use of materials. The second interposer 242 is attached to the active side 236 of the second integrated circuit 234 with a wire-in-film adhesive 248.

The wire-in-film adhesive 248 has a low viscosity and, as temperature increases, the viscosity gets lower. Therefore, the wire-in-film adhesive 248 can be easily pressed over the bond wires 222, above, and around the second integrated circuit 234 and then cured to harden the wire-in-film adhesive 248.

It has been discovered that the wire-in-film adhesive 248 should be a thermally conductive dielectric material. The wire-in-film adhesive 248 can be made of a B-stage material that can be hardened after curing and can maintain a predetermined thickness.

The second encapsulation 104 encapsulates the second integrated circuit 234 and the third integrated circuit 238. The second encapsulation 104 also partially encapsulates the second interposer 242 leaving a portion of the functional side 244 exposed.

The second encapsulation 104 has mold risers 250, which provide a standoff height 252. The standoff height 252 provides room for the solder balls 208 to connect the third package 102 to the second interposer 242.

The mold risers 250 also provide structural support for the third package 102. Between the solder balls 208 connecting the third package 102 to the second interposer 242 is the under-fill 210.

The under-fill 210 provides yet further structural support for the third package 102 and also for the solder balls 208 connecting the third package 102 to the second interposer 242. It has been discovered that the interconnection pads 246 on the functional side 244 of the second interposer 242 may be used to connect the third package 102 to the second package 230 with the solder balls 208. It has been discovered that this connection decreases the connection length reducing inductance, which may be parasitic in integrated circuit package systems.

The second package 230 is substantially larger than the first package 202 allowing more room for components such as memory devices. It has been discovered that the mold risers 226 help support and add greater structural stability effectively supporting the second package 230 when it is substantially larger than the first package 202.

The third package 102 may be a wafer level chip scale package (WLCSP), a redistributed line (RDL) die, or an area array package. Mounted below the first substrate 204 of the first package 202 are the solder balls 208.

Figure 3:
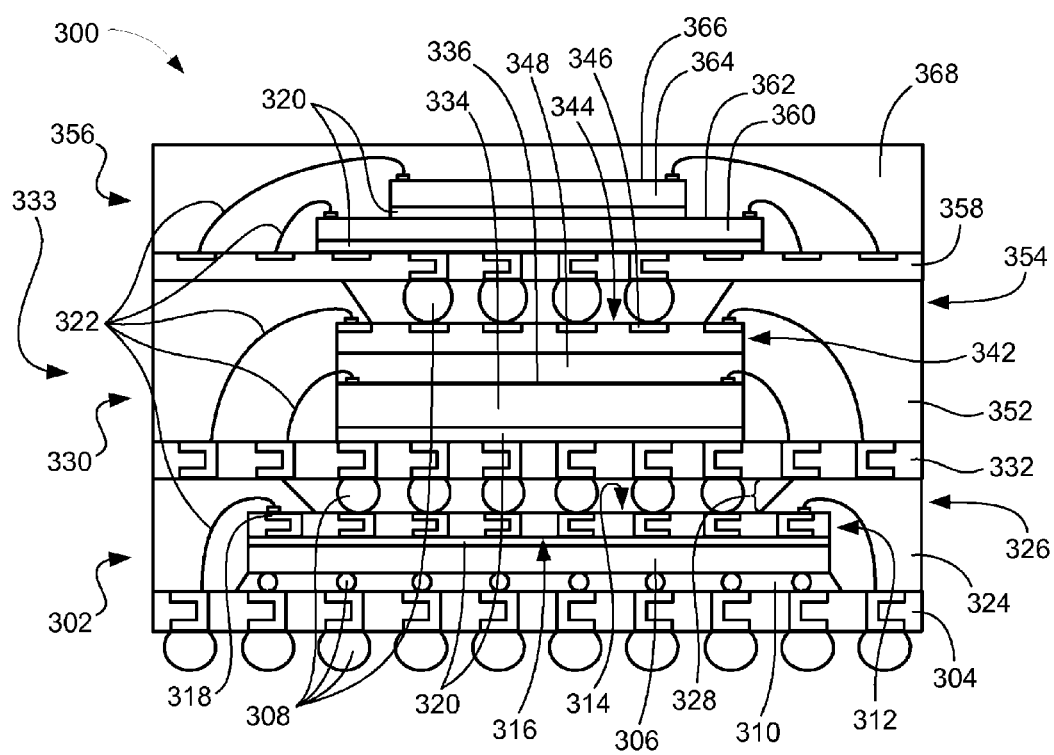
FIG. 3 is a cross-sectional view of an integrated circuit package system in a second embodiment of the present invention.

Referring now to FIG. 3, therein is shown a cross-sectional view of an integrated circuit package system 300 in a second embodiment of the present invention. The integrated circuit package system 300 is shown having a first package 302. The first package 302 has a first substrate 304 such as a laminated plastic or ceramic substrate.

Mounted above the first substrate 304 is a first integrated circuit 306 such as a flip chip. The first integrated circuit 306 may be replaced with a wire-bonded die, an inner stacking module, or an inverted inner stacking module.

The first integrated circuit 306 is connected to the first substrate 304 with interconnects 308 such as solder balls. Between the interconnects 308 an under-fill 310 is used to stabilize the first integrated circuit 306 and to reinforce the solder balls 308.

Mounted above the first integrated circuit 306 is a first interposer 312. The first interposer 312 is shown having two functional sides, such as a first functional side 314 and a second functional side 316, which allow for electrical signals to be routed between interconnection pads 318. The first interposer 312 is typically a UV stabilized woven glass and epoxy resin with etched copper conductive pathways.

The first interposer 312 is attached to the first integrated circuit 306 with a die attach adhesive 320. The first interposer 312 is connected to the first substrate 304 with an interconnection such as bond wires 322. Encapsulating the first integrated circuit 306, the bond wires 322 and the first interposer 312 is a first encapsulation 324 such as an epoxy mold compound (EMC).

The first encapsulation 324 has mold risers 326, which provide a standoff height 328 above the first interposer 312.

The mold risers 326 are formed around the bond wires 322. Mounted above the first package 302 is a second package 330.

The second package 330 has a second substrate 332 such as a laminated plastic or ceramic substrate. The second substrate 332 of the second package 330 is connected to the first interposer 312 of the first package 302 with the solder balls 308.

The standoff height 328 provides room for the solder balls 308, while the mold risers 326 offer structural support for the second package 330 and decreases stress loading on the solder balls 308 connecting the second package 330 to the first package 302.

It has been discovered that the use of the mold risers 326 to support the second package 330 greatly increases the structural resistance to mechanical shock and helps to ensure long life of the solder balls 308 by decreasing the stresses placed on the solder balls 308.

A dual fan-in package-on-package structure 333 is defined as the first package 302 and the second package 330 joined using the mold risers 326 of the first encapsulation 324 and providing the standoff height 328 to decrease structural strain on the interconnects 308.

The dual fan-in package-on-package structure 333 also includes the second substrate 332 connected to the first interposer 312 using the interconnects 308. The second substrate 332 of the second package 330 is attached to the mold risers 326 of the first encapsulation 324.

Mounted above the second substrate 332 is a second integrated circuit 334 such as a first wire-bonded die with an active side 336. The second integrated circuit 334 is attached to the second substrate 332 with the die attach adhesive 320. The active side 336 of the second integrated circuit 334 is connected to the second substrate 332 with the bond wires 322.

Mounted above the second integrated circuit 334 is a second interposer 342. The second interposer 342 is shown having a functional side 344 which allow for electrical signals to be routed between interconnection pads 346 exposed from the functional side 344.

The second interposer 342 is attached to the active side 336 of the second integrated circuit 334 with a wire-in-film adhesive 348. The wire-in-film adhesive 348 has a low viscosity and, as temperature increases, the viscosity gets lower. Therefore, the wire-in-film adhesive 348 can be easily pressed over the bond wires 322, above, and around the second integrated circuit 334 and then cured to harden the wire-in-film adhesive 348.

It has been discovered that the wire-in-film adhesive 348 should be a thermally conductive dielectric material. The wire-in-film adhesive 348 can be made of a B-stage material that can be hardened after curing and can maintain a predetermined thickness.

The second interposer 342 is connected to the second substrate with the bond wires 322. A second encapsulation 352 encapsulates the second integrated circuit 334 and the second interposer 342.

The second package 330 is substantially larger than the first package 302 allowing more room for components such as memory devices. It has been discovered that the mold risers 326 help support and add greater structural stability effectively supporting the second package 330 when it is substantially larger than the first package 302.

The second encapsulation 352 has mold risers 354. The mold risers 354 of the second encapsulation 352 provides more support for a third package 356 mounted above the second package 330 and connected to the second interposer 342 with the solder balls 308.

The third package 356 is shown having a third substrate 358 such as a laminated plastic or ceramic substrate. Mounted above the third substrate 358 is a third integrated circuit 360 with an active side 362.

Mounted above the third integrated circuit 360 is a fourth integrated circuit 364 with an active side 366. The fourth integrated circuit 364 is attached to the active side 362 of the third integrated circuit 360 with the die attach adhesive 320.

The third integrated circuit 360 is attached to the third substrate 358 with the die attach adhesive 320. The active side 366 of the fourth integrated circuit 364 and the active side 362 of the third integrated circuit 360 are connected to the third substrate 358 with the bond wires 322.

A third encapsulation 368 encapsulates the third integrated circuit 360, and the fourth integrated circuit 364. Mounted below the first substrate 304 of the first package 302 are the solder balls 308.

Figure 4:
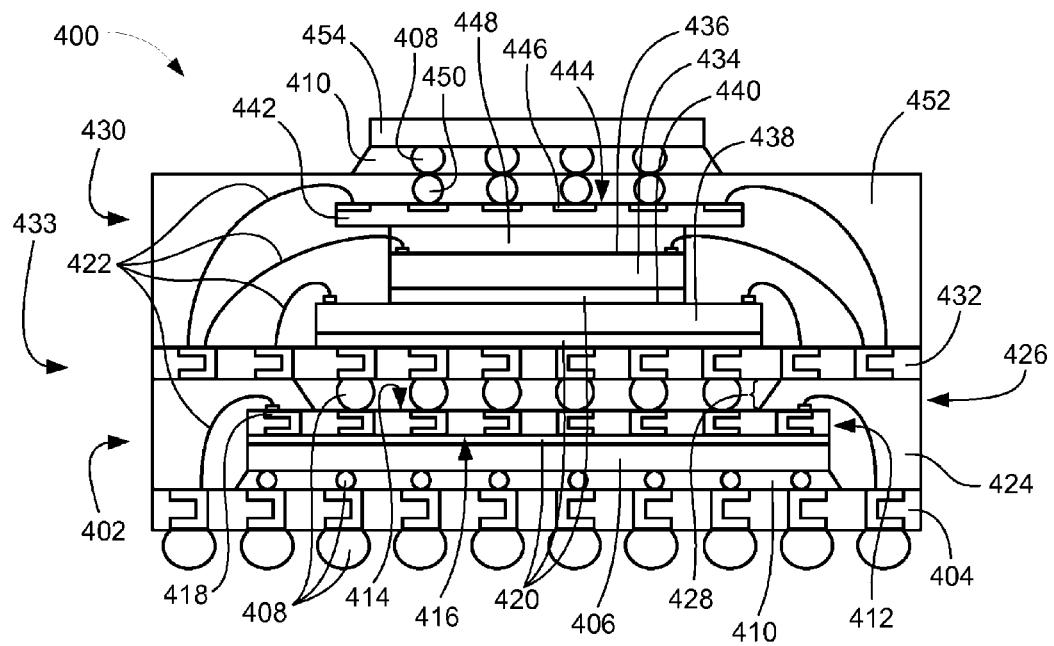
FIG. 4 is a cross-sectional view of an integrated circuit package system in a third embodiment of the present invention.

Referring now to FIG. 4, therein is shown a cross-sectional view of an integrated circuit package system 400 in a third embodiment of the present invention. The integrated circuit package system 400 is shown having a first package 402. The first package 402 has a first substrate 404 such as a laminated plastic or ceramic substrate.

Mounted above the first substrate 404 is a first integrated circuit 406 such as a flip chip. The first integrated circuit 406 may be replaced with a wire-bonded die, an inner stacking module, or an inverted inner stacking module.

The first integrated circuit 406 is connected to the first substrate 404 with interconnects 408 such as solder balls. Between the interconnects 408 an under-fill 410 is used to stabilize the first integrated circuit 406 and to reinforce the solder balls 408.

Mounted above the first integrated circuit 406 is a first interposer 412. The first interposer 412 is shown having two functional sides, such as a first functional side 414 and a second functional side 416, which allow for electrical signals to be routed between interconnection pads 418. The first interposer 412 is typically a UV stabilized woven glass and epoxy resin with etched copper conductive pathways.

The first interposer 412 is attached to the first integrated circuit 406 with a die attach adhesive 420. The first interposer 412 is connected to the first substrate 404 with an interconnection such as bond wires 422. Encapsulating the first integrated circuit 406, the bond wires 422 and the first interposer 412 is a first encapsulation 424 such as an epoxy mold compound (EMC).

The first encapsulation 424 has mold risers 426, which provide a standoff height 428 above the first interposer 412. The mold risers 426 are formed around the bond wires 422. Mounted above the first package 402 is a second package 430.

The second package 430 has a second substrate 432 such as a laminated plastic or ceramic substrate. The second substrate 432 of the second package 430 is connected to the first interposer 412 of the first package 402 with the solder balls 408.

The standoff height 428 provides room for the solder balls 408, while the mold risers 426 offer structural support for the second package 430 and decreases stress loading on the solder balls 408 connecting the second package 430 to the first package 402.

It has been discovered that the use of the mold risers 426 to support the second package 430 greatly increases the structural resistance to mechanical shock and helps to ensure long life of the solder balls 408 by decreasing the stresses placed on the solder balls 408.

A dual fan-in package-on-package structure 433 is defined as the first package 402 and the second package 430 joined using the mold risers 426 of the first encapsulation 424 and providing the standoff height 428 to decrease structural strain on the interconnects 408.

The dual fan-in package-on-package structure 433 also includes the second substrate 432 connected to the first interposer 412 using the interconnects 408. The second substrate 432 of the second package 430 is attached to the mold risers 426 of the first encapsulation 424.

Mounted above the second substrate 432 is a second integrated circuit 434 such as a first wire-bonded die with an active side 436. Mounted below the second integrated circuit 434 is a third integrated circuit 438 such as a second wire-bonded die with an active side 440.

The third integrated circuit 438 is attached to the second substrate 432 with the die attach adhesive 420. The second integrated circuit 434 is attached to the active side 440 of the third integrated circuit 438 with the die attach adhesive 420.

The active side 436 of the second integrated circuit 434 is connected to the second substrate 432 with the bond wires 422. The active side 440 of the third integrated circuit 438 is connected to the second substrate 432 with the bond wires 422.

Mounted above the second integrated circuit 434 is a second interposer 442. The second interposer 442 is shown having a functional side 444 which allow for electrical signals to be routed between interconnection pads 446 exposed from the functional side 444.

The second interposer 442 is attached to the active side 436 of the second integrated circuit 434 with a wire-in-film adhesive 448. The wire-in-film adhesive 448 has a low viscosity and, as temperature increases, the viscosity gets lower. Therefore, the wire-in-film adhesive 448 can be easily pressed over the bond wires 422, above, and around the second integrated circuit 434 and then cured to harden the wire-in-film adhesive 448.

It has been discovered that the wire-in-film adhesive 448 should be a thermally conductive dielectric material. The wire-in-film adhesive 448 can be made of a B-stage material that can be hardened after curing and can maintain a predetermined thickness.

The second interposer 442 is connected to the second substrate with the bond wires 422. The interconnection pads 446 on the second interposer 442 are electrically connected to stud bumps 450.

The stud bumps 450 provide an electrical path for electrical signals in and out of the second package 430. The stud bumps 450 may also be connected to the bond wires 422 that connect the second interposer 442 with the second substrate 432.

A second encapsulation 452 encapsulates the stud bumps 450 and provides structural rigidity. The second encapsulation 452 also encapsulates the second integrated circuit 434 and the third integrated circuit 438.

The stud bumps 450 are exposed from the second encapsulation 452. The second package 430 is substantially larger than the first package 402 allowing more room for components such as memory devices. It has been discovered that the mold risers 426 help support and add greater structural stability effectively supporting the second package 430 when it is substantially larger than the first package 402.

Mounted above the second package 430 is a third package 454 such as a wafer level chip scale package (WLCSP), a redistributed line (RDL) die, or an area array package. The third package 454 is connected to the stud bumps 450 exposed from the second encapsulation 452 with the solder balls 408.

Between the third package 454 and the second package 430 is the under-fill 410. Mounted below the first substrate 404 of the first package 402 are the solder balls 408.

Figure 5:
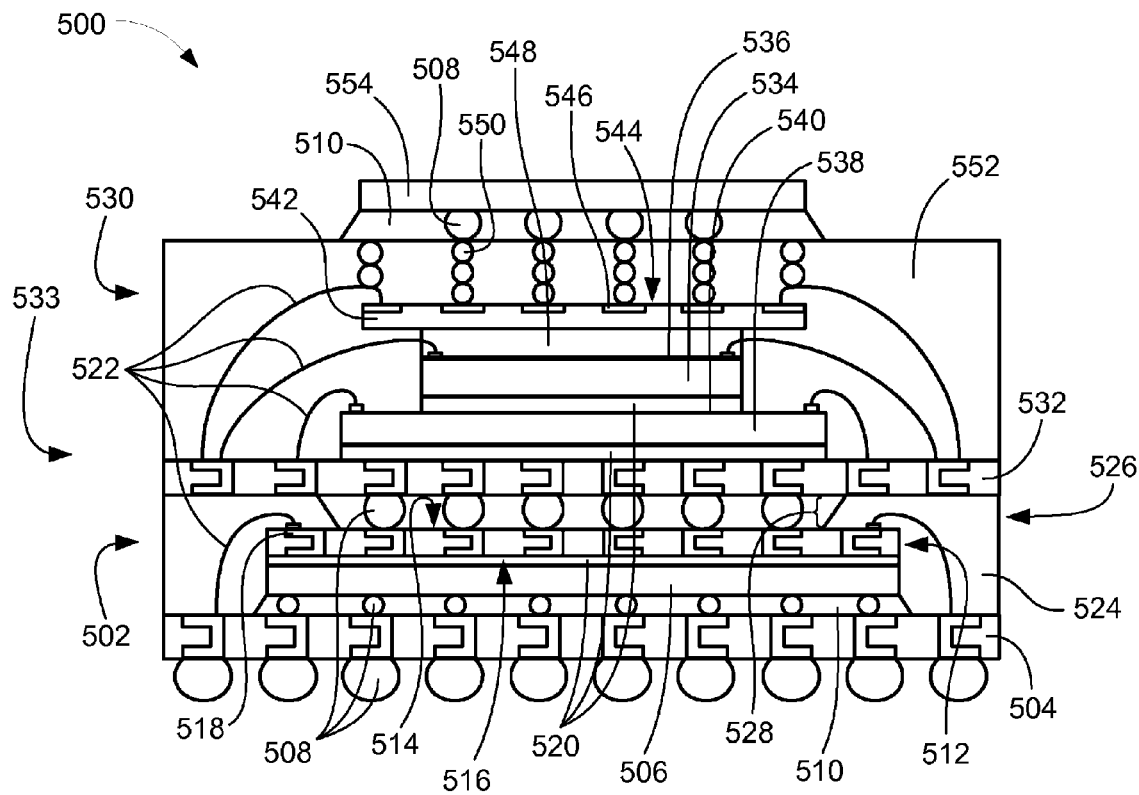
FIG. 5 is a cross-sectional view of an integrated circuit package system in a fourth embodiment of the present invention.

Referring now to FIG. 5, therein is shown a cross-sectional view of an integrated circuit package system 500 in a fourth embodiment of the present invention. The integrated circuit package system 500 is shown having a first package 502. The first package 502 has a first substrate 504 such as a laminated plastic or ceramic substrate.

Mounted above the first substrate 504 is a first integrated circuit 506 such as a flip chip. The first integrated circuit 506 may be replaced with a wire-bonded die, an inner stacking module, or an inverted inner stacking module.

The first integrated circuit 506 is connected to the first substrate 504 with interconnects 508 such as solder balls. Between the interconnects 508 an under-fill 510 is used to stabilize the first integrated circuit 506 and to reinforce the solder balls 508.

Mounted above the first integrated circuit 506 is a first interposer 512. The first interposer 512 is shown having two functional sides, such as a first functional side 514 and a second functional side 516, which allow for electrical signals to be routed between interconnection pads 518. The first interposer 512 is typically a UV stabilized woven glass and epoxy resin with etched copper conductive pathways.

The first interposer 512 is attached to the first integrated circuit 506 with a die attach adhesive 520. The first interposer 512 is connected to the first substrate 504 with an interconnection such as bond wires 522. Encapsulating the first integrated circuit 506, the bond wires 522 and the first interposer 512 is a first encapsulation 524 such as an epoxy mold compound (EMC).

The first encapsulation 524 has mold risers 526, which provide a standoff height 528 above the first interposer 512. The mold risers 526 are formed around the bond wires 522. Mounted above the first package 502 is a second package 530.

The second package 530 has a second substrate 532 such as a laminated plastic or ceramic substrate. The second substrate 532 of the second package 530 is connected to the first interposer 512 of the first package 502 with the solder balls 508.

The standoff height 528 provides room for the solder balls 508, while the mold risers 526 offer structural support for the second package 530 and decreases stress loading on the solder balls 508 connecting the second package 530 to the first package 502.

It has been discovered that the use of the mold risers 526 to support the second package 530 greatly increases the structural resistance to mechanical shock and helps to ensure long life of the solder balls 508 by decreasing the stresses placed on the solder balls 508.

A dual fan-in package-on-package structure 533 is defined as the first package 502 and the second package 530 joined using the mold risers 526 of the first encapsulation 524 and providing the standoff height 528 to decrease structural strain on the interconnects 508.

The dual fan-in package-on-package structure 533 also includes the second substrate 532 connected to the first interposer 512 using the interconnects 508. The second substrate 532 of the second package 530 is attached to the mold risers 526 of the first encapsulation 524.

Mounted above the second substrate 532 is a second integrated circuit 534 such as a first wire-bonded die with an active side 536. Mounted below the second integrated circuit 534 is a third integrated circuit 538 such as a second wire-bonded die with an active side 540.

The third integrated circuit 538 is attached to the second substrate 532 with the die attach adhesive 520. The second integrated circuit 534 is attached to the active side 540 of the third integrated circuit 538 with the die attach adhesive 520.

The active side 536 of the second integrated circuit 534 is connected to the second substrate 532 with the bond wires 522. The active side 540 of the third integrated circuit 538 is connected to the second substrate 532 with the bond wires 522.

Mounted above the second integrated circuit 534 is a second interposer 542. The second interposer 542 is shown having a functional side 544 which allow for electrical signals to be routed between interconnection pads 546 exposed from the functional side 544.

The second interposer 542 is attached to the active side 536 of the second integrated circuit 534 with a wire-in-film adhesive 548. The wire-in-film adhesive 548 has a low viscosity and, as temperature increases, the viscosity gets lower. Therefore, the wire-in-film adhesive 548 can be easily pressed over the bond wires 522, above, and around the second integrated circuit 534 and then cured to harden the wire-in-film adhesive 548.

It has been discovered that the wire-in-film adhesive 548 should be a thermally conductive dielectric material. The wire-in-film adhesive 548 can be made of a B-stage material that can be hardened after curing and can maintain a predetermined thickness.

The second interposer 542 is connected to the second substrate with the bond wires 522. The interconnection pads 546 on the second interposer 542 are electrically connected to stud bumps 550.

The stud bumps 550 are stacked to provide an electrical path for electrical signals in and out of the second package 530. The stud bumps 550 may also be connected to the bond wires 522 that connect the second interposer 542 with the second substrate 532.

A second encapsulation 552 encapsulates the stud bumps 550 and provides structural rigidity when the stud bumps 550 are stacked. The stud bumps 550 may be stacked by drilling and filling the second encapsulation 552 with the stud bumps 550.

The stud bumps 550 may also be stacked by successive layers of electroplating and applying layers of photo resist, then stripping the photo resist leaving the stud bumps 550 stacked. The stud bumps 550 may then be encapsulated by the encapsulation 552.

Still another method of stacking the stud bumps 550 may be successive electroplating, encapsulating, planning back the encapsulation, electroplating, and encapsulating. The second encapsulation 552 also encapsulates the second integrated circuit 534 and the third integrated circuit 538.

The stud bumps 550 are exposed from the second encapsulation 552. The second package 530 is substantially larger than the first package 502 allowing more room for components such as memory devices. It has been discovered that the mold risers 526 help support and add greater structural stability effectively supporting the second package 530 when it is substantially larger than the first package 502.

Mounted above the second package 530 is a third package 554 such as a wafer level chip scale package (WLCSP), a redistributed line (RDL) die, or an area array package. The third package 554 is connected to the stud bumps 550 exposed from the second encapsulation 552 with the solder balls 508.

Between the third package 554 and the second package 530 is the under-fill 510. Mounted below the first substrate 504 of the first package 502 are the solder balls 508.

Figure 6:
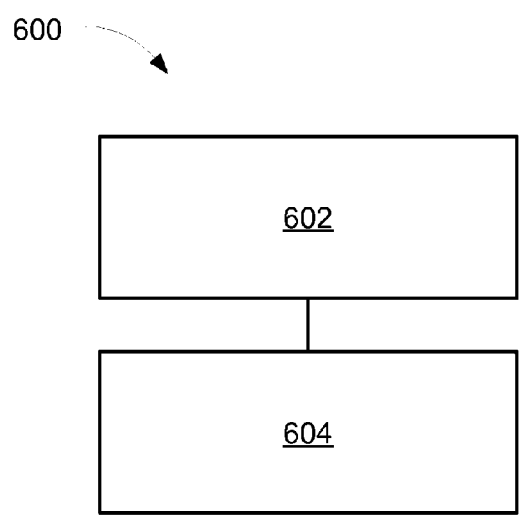
FIG. 6 is a flow chart of a system for manufacturing the integrated circuit package system of FIG. 1 in an embodiment of the present invention.

Referring now to FIG. 6, therein is shown a flow chart of a system 600 for manufacturing the integrated circuit package system 100 of FIG. 1 in an embodiment of the present invention. The system 600 includes providing a first package having a first interposer mounted over a first integrated circuit and the first integrated circuit encapsulated by a first encapsulation in a block 602; and connecting a second package over the first interposer and on the first encapsulation, the second package including a second integrated circuit having a wire-in-film adhesive thereover, a second interposer mounted on the wire-in-film adhesive and encapsulated by a second encapsulation encapsulating the second integrated circuit, the second interposer including an interconnection pad for connecting a third package to the top thereof in a block 604.

Thus, it has been discovered that the interposer in combination with a mold riser system of the present invention furnishes important and heretofore unknown and unavailable solutions, capabilities, and functional aspects for package on package configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package system comprising:
providing a first package having a first interposer mounted over a first integrated circuit and the first integrated circuit encapsulated by a first encapsulation; and
connecting a second package over the first interposer and on the first encapsulation, the second package including a second integrated circuit having a wire-in-film adhesive thereover, a second interposer mounted on the wire-in-film adhesive and encapsulated by a second encapsulation encapsulating the second integrated circuit, the second interposer including an interconnection pad for connecting a third package to the top thereof.

2. The system as claimed in claim 1 wherein:
connecting the second package includes mounting a third integrated circuit below the second integrated circuit.

3. The system as claimed in claim 1 wherein:
connecting the second package includes forming a mold riser in the second encapsulation.

4. The system as claimed in claim 1 wherein:
connecting the second package includes forming a stud bump in the second encapsulation and connected to the second interposer.

5. The system as claimed in claim 1 wherein:
connecting the second package includes forming stud bumps that are stacked in the second encapsulation and connected to the second interposer.

6. An integrated circuit package system comprising:
providing a first package having a first interposer mounted over a first integrated circuit and the first integrated circuit encapsulated by a first encapsulation;
connecting a second package over the first interposer and on the first encapsulation, the second package including a first wire-bonded die having a wire-in-film adhesive thereover, a second interposer mounted on the wire-in-film adhesive and encapsulated by a second encapsulation encapsulating the first wire-bonded die, the second interposer including an interconnection pad; and
mounting a third package above the second package and connected to the interconnection pad.

7. The system as claimed in claim 6 wherein:
connecting the second package includes forming a stud bump in the second encapsulation and connected to a bond wire; and
mounting a third package includes connecting the third package to the stud bump.

8. The system as claimed in claim 6 wherein:
connecting the second package includes forming a mold riser in the second encapsulation; and
mounting the third package includes mounting the third package touching the mold riser.

9. The system as claimed in claim 6 wherein:
connecting the second package includes only partially encapsulating the second interposer with the second encapsulation.

10. The system as claimed in claim 6 further comprising:
filling between the third package and the second package with an under-fill.

11. An integrated circuit package system comprising:
a first package having a first interposer mounted over a first integrated circuit and the first integrated circuit encapsulated by a first encapsulation; and
a second package connected over the first interposer and on the first encapsulation, the second package including a second integrated circuit having a wire-in-film adhesive thereover, a second interposer mounted on the wire-in-film adhesive and encapsulated by a second encapsulation encapsulating the second integrated circuit, the second interposer including an interconnection pad for connecting a third package to the top thereof.

12. The system as claimed in claim 11 wherein:
the second package includes a third integrated circuit mounted below the second integrated circuit.

13. The system as claimed in claim 11 wherein:
the second package includes a mold riser in the second encapsulation.

14. The system as claimed in claim 11 wherein:
the second package includes a stud bump in the second encapsulation and the stud bump being connected to the second interposer.

15. The system as claimed in claim 11 wherein:
the second package includes stud bumps that are stacked in the second encapsulation and the stud bumps are connected to the second interposer.

16. The system as claimed in claim 11 further comprising:
a third package mounted above the second package and connected to the interconnection pad;
wherein:
the second package includes a second substrate mounted below the second integrated circuit;
the second integrated circuit is a first wire-bonded die; and
the second package includes a bond wire connecting the second interposer to the second substrate.

17. The system as claimed in claim 16 wherein:
the second package includes a stud bump in the second encapsulation and the stud bump is connected to bond wire; and
the third package is connected to the stud bump.

18. The system as claimed in claim 16 wherein:
the second package includes a mold riser in the second encapsulation; and
the third package is touching the mold riser.

19. The system as claimed in claim 16 wherein:
the second interposer is only partially encapsulated by the encapsulation.

20. The system as claimed in claim 16 further comprising:
an under-fill between the third package and the second package.

* * * * *